United States Patent [19]

Fanene

[11] 4,366,925

[45] Jan. 4, 1983

[54] DEVICE FOR NON-DESTRUCTIVE DESOLDERING AND REMOVAL OF A MODULAR ELECTRONIC COMPONENT FROM A SUBSTRATE

[75] Inventor: Bernard Fanene, Trelaze, France

[73] Assignee: Compagnie Internationale pour l'Informatique Cii-Honeywell Bull (Societe Anonyme), Paris, France

[21] Appl. No.: 158,708

[22] Filed: Jun. 12, 1980

[30] Foreign Application Priority Data

Jun. 13, 1979 [FR] France .............................. 79 15126

[51] Int. Cl.$^3$ .............................................. B23K 3/00
[52] U.S. Cl. ..................................... 228/20; 156/584; 228/59
[58] Field of Search ...................... 228/19, 20, 59, 191, 228/265, 103–104; 29/762, 764, 402.03; 156/344, 584

[56] References Cited

U.S. PATENT DOCUMENTS

| 3,412,451 | 11/1968 | Vieser et al. | 29/407 X |
| 3,557,430 | 1/1971 | Jones | 228/19 |
| 3,644,980 | 2/1972 | Class, Jr. et al. | 228/20 X |
| 3,661,315 | 5/1972 | Helton | 228/20 |
| 3,735,911 | 5/1973 | Ward | 228/19 |
| 3,868,764 | 3/1975 | Hartleroad et al. | 29/589 |
| 3,969,813 | 7/1976 | Minetti et al. | 156/344 X |

FOREIGN PATENT DOCUMENTS 1291123  9/1972  United Kingdom .
1401116  7/1975  United Kingdom .

Primary Examiner—Kenneth J. Ramsey
Attorney, Agent, or Firm—Kerkam, Stowell, Kondracki & Clarke

[57] ABSTRACT

A device for semi-automatic dismantling of a modular component which is soldered and attached to a substrate forming a printed circuit. The component to be dismantled is placed under a hot gas source while a force member applies a resilient thrust, the force member comprising a needle arranged to be placed at the base of the component. The needle is slightly bent to apply a biasing force before controlling the ejection of the hot gas to cause melting of the solder at the ends of the connecting pieces and melting of the adhesive layer by which the component is attached to the substrate.

33 Claims, 3 Drawing Figures

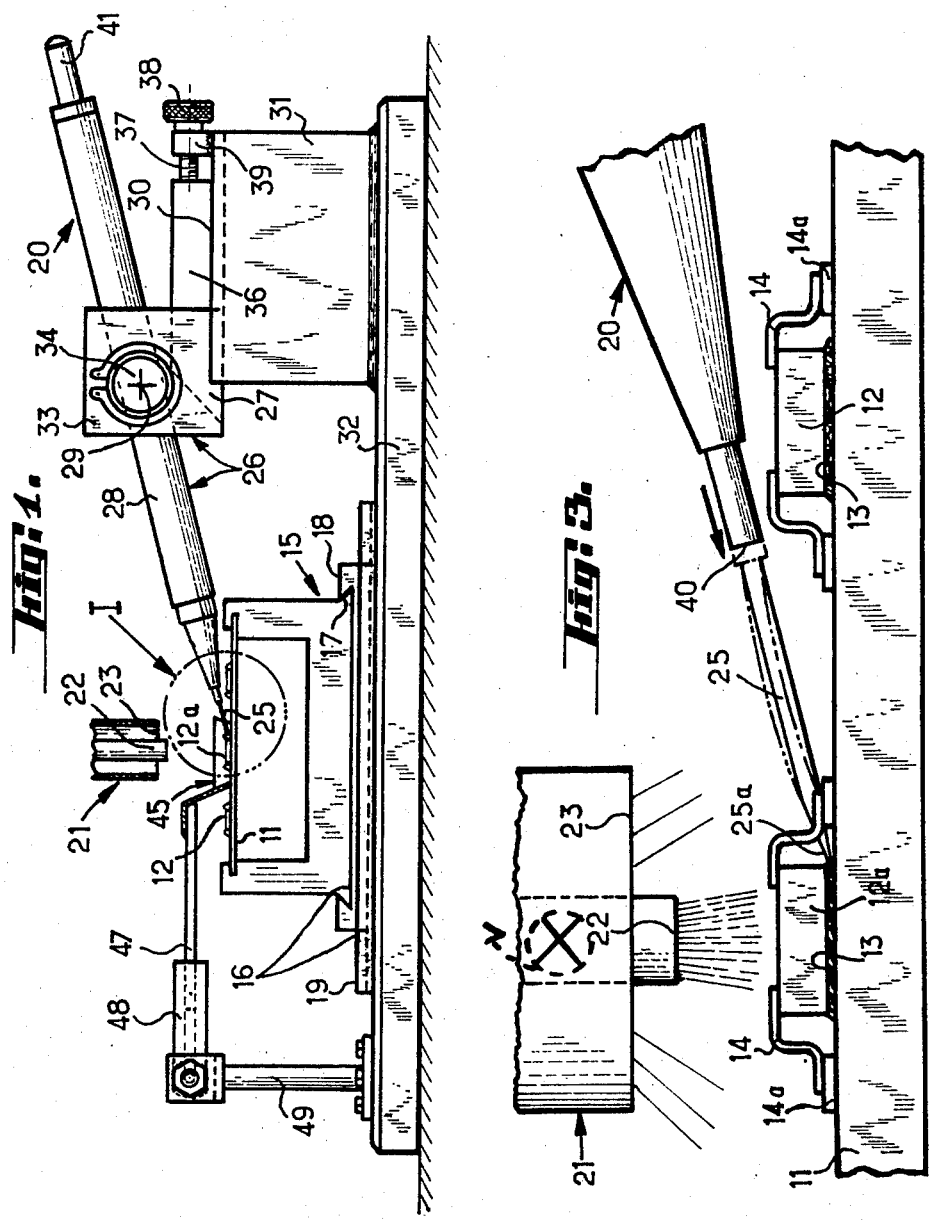

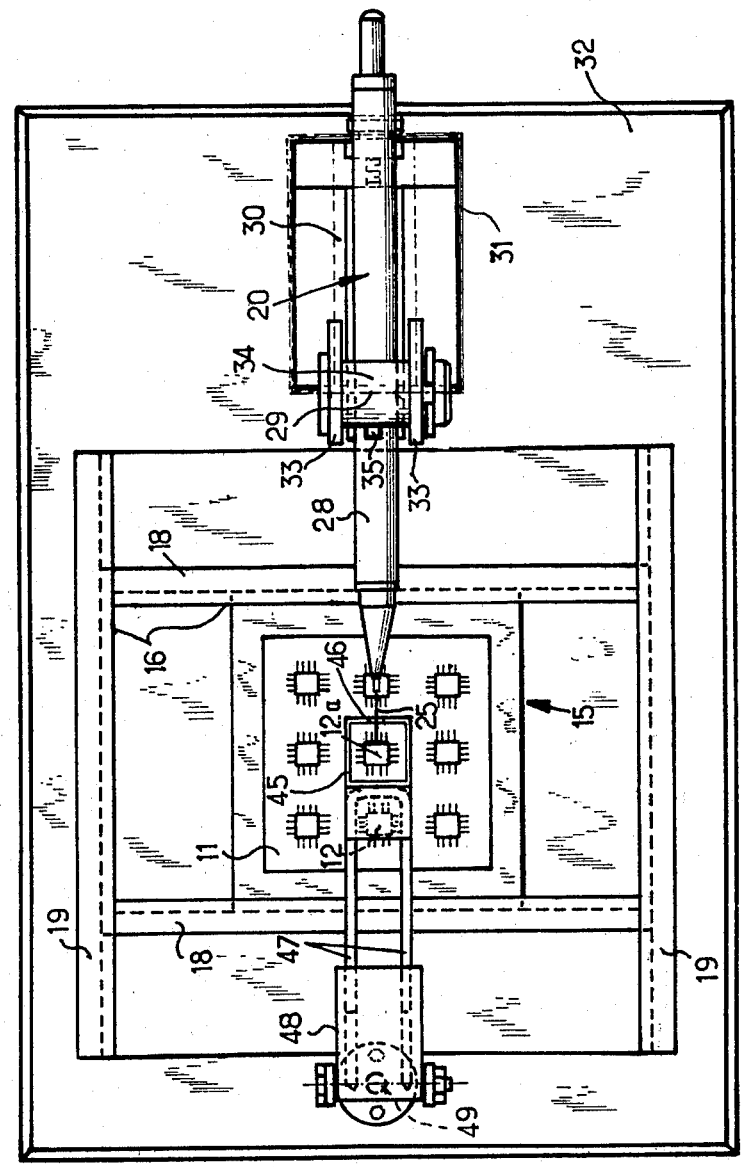

DEVICE FOR NON-DESTRUCTIVE DESOLDERING AND REMOVAL OF A MODULAR ELECTRONIC COMPONENT FROM A SUBSTRATE

BACKGROUND OF THE INVENTION

1. Field of the Invention

The invention relates to the dismantling from a substrate of a microelectronic component which is both attached to a substrate by its base and soldered by connecting pieces to conductors on the said substrate.

2. Description of the Prior Art

The ever-increasing miniaturisation of electronic systems, principally in computers, has led recently to a technology in which the active and/or passive elements are produced in the form of non-coated integrated circuits directly mounted on substrates of ceramic forming multi-layer printed circuits. The upper layer of the substrate comprises conductors which are at least partially covered by a layer of solder (principally an indium-lead alloy), some of which are fitted to or end in studs which are disposed along a given perimeter within which an electric modular component (an integrated circuit including a certain number of transistors, diodes, resistors and possibly capacitors) is attached by its base on the substrate. The modular electronic component further comprises a number of connecting pieces which protrude laterally along its edge and which are attached to the studs. Mounting of these modular components is therefore made both by attaching the base on the substrate and by soldering the end of the connecting pieces to the corresponding studs of the substrate. The soldering is effected in a single step by the fusion of an indium-lead alloy previously placed on the substrate and principally on the studs. This technique has numerous advantages both insofar as concerns the degree of miniaturisation attained and the reliability of the circuits. However, it can happen that one of the modular components is found to be defective on checking, or again that a modification in the concept of the apparatus necessitates the replacement of one or more modular components which have already been mounted on a certain number of substrates, for example in the context of the contruction of a prototype of preproduction.

The replacement of such modular components poses a number of problems. First of all, if the modular component is not defective it is useful to be able to retrieve it intact so as to possibly reuse it in another circuit. Since the connecting pieces of this modular component are extremely fragile, a wrong move in the course of dismantling it can very easily cause the breaking off of one or more of these connecting pieces. Since the modular component is both attached on the substrate and soldered to the conductors on the substrate by all the connecting pieces, it is therefore necessary to be able to melt the adhesive and all the soldered connections before removing the modular component. This operation is very difficult to carry out manually. Secondly, it is especially important to preserve the substrate which should definitely be reused. In particular, it is important not to damage the layer of solder on the conductors carried by the external surface of the substrate and notably the parts of this layer which are on the studs, since the solder at this point must then be reused for the electric connection of the replacement modular component. The invention seeks to provide a satisfactory solution to all these problems.

SUMMARY OF THE INVENTION

More particularly, the invention relates to a device for dismantling an electronic modular component comprising a number of connecting pieces soldered on a substrate forming a printed circuit wherein the modular component is attached by the base on to the substrate by means of a thermofusible adhesive agent, comprising in combination a substrate support provided with adjustable positioning means for permitting the said component to be guided to a predetermined position;

a member for applying an adjustable resilient thrust which can be applied laterally to the modular component when the latter is in the predetermined position; and a means for applying heat by circulation of hot gas, the latter means comprising at least one hot gas ejection outlet directed towards the said predetermined position.

The above-mentioned heating means permits both softening of the solder at the end of the connecting pieces as well as of the adhesive holding the modular component on the substrate. It is important to note in its respect that the layer of adhesive should be liquified or softened after melting of all the solder at the ends of the connecting pieces. At the moment of liquification or softening of the adhesive, the force applied laterally to the component by the member for applying resilient thrust causes a sharp ejection of the component without damaging the conductors of the substrate or the component itself. If the adhesive yields before the solder, certain corresponding pieces could be torn off the component at the moment of ejection and remain attached to the substrate.

In this sense, the invention therefore also relates to a method for dismantling an electronic modular component comprising a number of connecting pieces and attached by its base on the substrate by means of a thermofusible adhesive agent, the said connecting pieces being connected to respective studs of said substrate by solder, consisting of submitting the said component to a lateral ejection force while fusing the solder and, causing the fusion and softening of the said adhesive agent.

According to a particularly advantageous embodiment of the invention, the member which applies resilient thrust can be constituted by a simple flexible needle which can be positioned laterally to the base of the component and at a slight inclination to the plane of the substrate and is arranged to be advanced slowly under force so as to bend it in order to permit it to exercise a resilient pressure on the modular component.

BRIEF DESCRIPTION OF THE DRAWING

The invention will be better understood and other objects, details and advantages of the latter will be more readily apparent in the light of the explanation which follows of a preferred embodiment of a device according to the invention, given solely by way of example, and with references to the non-limiting accompanying drawings in which:

FIG. 1 is a schematic elevational view of the invention;

FIG. 2 is a plan view of the device of FIG. 1, with the heating means removed for clarity; and FIG. 3 is a partial, large-scale view of the indicated circular region I of FIG. 1, a thermal protection screen not being shown for greater clarity.

DESCRIPTION OF THE PREFERRED EMBODIMENT

In the drawings is shown a substrate 11, of ceramic for example, forming a multilayer printed circuit. This substrate carries a certain number of electronic modular components 12. Each of these components is fixed by its base on the said substrate by means of a layer of thermofusible adhesive 13. Each modular component comprises a plurality of connecting pieces 14 disposed along the periphery of the component and protruding outwards to be electrically connected to the circuit elements carried by the upper layer of the substrate 11. These circuit elements comprise principally conductive terminal connectors, conductive layers or strips represented by studs 14a to which are soldered the ends of the connecting pieces 14. For example, studs 14a can be basically formed by a deposit of an indium and lead alloy. The soldering of the connecting pieces 14, upon mounting a component, may be made simultaneously for all the connecting pieces by refusion of the studs formed by the above-mentioned alloy.

When it is desired to dismantle one of the components 12 from the substrate 11, the substrate is placed on the device shown in the drawings and, more particularly, on a substrate carrier 15 having means 16 for adjustably positioning the substrate 11 which permits positioning the component (12a) to be dismantled in a predetermined position. More precisely, the support 15 is provided with lateral dovetail edges 17 allowing its displacement in guides 18 which are also able to move perpendicularly thereto in guides 19, the whole forming a rudimentary X-Y table. It goes without saying that the substrate carrier 15 and the positioning means for the latter may be formed by a large number of technically equivalent variations which clearly come within the scope of the invention.

The invention further comprises a force member 20 for the application of an adjustable resilient thrust, and a heating means 21 for applying heat by ejection of a hot gas. The heating means 21 is only shown in the drawings by its hot gas openings which serve to direct hot gas towards the predetermined position where the electronic component 12a which is desired to be dismantled should be located. Preferably the heating means 21 comprises a first gas flow tube having central opening 22 supplied by a first hot gas at the first temperature and a second surrounding gas flow tube of greater diameter having an annular opening 23 surrounding the opening 22 and supplied by a second hot gas at a second temperature which is lower than the temperature of the first gas mentioned.

The heating means 21 is arranged so that hot gas at the second temperature is always emitted at opening 23, while the hot gas at the first temperature is only emitted at opening 22 if a special order or command is given by an operator. In other words, the annular opening 23 can be directly connected to a source of hot gas at the second layer temperature while the central opening 22 is connected to another source of hot gas at the said first temperature by means of a valve v or similar device, shown diagrammatically in FIG. 3, intended to be operated by the operator. Such means for applying heated gasses through two co-axial ejection openings are well known and find use for soldering logic components and accordingly will not be described in great detail. Such a machine for the production of hot gas is manufactured by the LAURIER Company under its model designation HG 730, and has been used as a heating source or means in accordance with the present invention and has given satisfactory results. In such a machine, there is a single heating member such as an electric resistance arrange to heat air in a circulating circuit leading to the opening 22 when air is admitted to circulate in this circuit, i.e., when an electrovalve, inserted in the latter, is activated to its open position by the operator. The casing of the heating resistor is normally cooled by another flow of air which is itself directed towards the opening 23 so that one and the same heating member is used for the two hot air sources, the gas emanating from opening 23 being at a lower temperature.

The force member 20 for applying resilient thrust is adjustable in translation so that its free end formed by a flexible needle 25, can be applied laterally against the modular component 12a when the latter is at a predetermined position, that is to say below the openings 22 and 23 as shown in FIG. 3. More precisely, the needle 25 is mounted at the end of a positioning support 26 comprising a stand 27 which is movable in translation and a needle holder 28 which is mounted so as to pivot on the stand 27 about a horizontal axis 29. Axis 29 is perpendicular to the direction of displacement of the stand 27. Stand 27 can slide in a guide 30 which is formed in the upper face of a base 31 which is fixed or mounted on the same support plate 32 as the positioning means 16. The longitudinal axis of the guide 30, which defines the direction of displacement of the needle holder 28, is directed towards the above-mentioned predetermined position where the modular component 12a should be located so that the free end 25a of the needle 25 can be placed close to the said predetermined position.

The stand 27 is constituted by a frame 33 in which is mounted a pivot member 34 defining the pivot axis 29. This pivot member is pierced by a hole in which the needle holder 28 is engaged and held. A stop 35, shown in FIG. 2, integral with the needle holder 28 permits the latter to be blocked longitudinally with respect to the pivot member 34. The movable stand 27 further comprises a guide piece 36 which moves in the guide 30 and comprises a threaded hole, parallel to the axis of the said guide, in which hole is engaged a position-adjusting screw 37, having a knurled control knob 38 on its end. Movement of the screw 37 is restricted by an extension 39 of the base 31.

The needle holder 28 is of a general cylindrical shape and comprises a mechanism for longitudinal positioning of the needle 25, so as to permit the adjustment of the useful length of the needle protruding with respect to the end 40 of the needle holder. The member 41 for operating this longitudinal positioning mechanism is situated at the opposite end of the needle holder from the needle 25. The positioning mechanism, which is housed inside the needle holder 28, is not described in detail, but it is pointed out that it can be similar to that of certain commercial draftsman's pencils, the needle 25 purely and simply replacing the lead. Obviously, there can be numerous variations of the arrangement of the member which applies resilient stress but, inasmuch as the active element of this member is a needle 25, the member applying resilient stress will preferably always be made so that the needle is slightly inclined to the horizontal when it is in a position of lateral resilient thrust with respect to the component 12a, i.e. in the position shown in FIG. 3.

The device is completed by a thermal screen 45 which can be positioned to surround the modular component 12a so as to protect the neighboring circuit elements on the substrate 11. This thermal screen is in the general shape of a frame which widens out the direction of the heating means 21. It may also comprise a slot 46 on the side facing the needle 25 so as not to hinder the positioning of the latter. According to the embodiment shown, the thermal screen 45 is carried by two parallel rods 47 engaged and positioned in an adjustable manner by sliding in corresponding holes formed in a piece 48 which forms a support arm. Piece 48 may be articulated, i.e. pivoted to the upper end of a vertical member 49 which is fixed to the support plate 32 opposite the base 31. By more or less retracting the rods 47 into the piece 48, the rest position of the thermal screen 45 on the substrate 11 can be adjusted so that the latter surrounds the component 12a without touching it.

The operation of the device which has just been described will be apparent from the preceding description. The substrate 11 is placed on the support, the latter is maneuvered as to position the modular component 12a in a predetermined position below the openings 22 and 23. The hot air coming from the annular opening 23 permits a preheating of the of the component to be dismantled and is capable of raising the temperature of the solder and thermofusible adhesive 13 without, however, reaching their respective fusion or softening tempratures. The thermal screen 45 is positioned around the component 12a and the desired useful length of the needle 25 is adjusted by means of the operating member 41. The knurled knob 28 is moved to bring the end 25a of the needle 25 in lateral contact with the component 12a near its base. Then, still moving the knurled knob 38, the needle holder 28 is moved slightly further in the direction of the component 12a. This further movement causes the needle 25 to bend slightly as shown in dots and dashes in FIG. 3. As a result, the needle exerts a lateral resilient thrust from this moment, that is to say an ejection force, on the component 12a. It is then sufficient to activate the valve v which controls the ejection of hot gas from the opening 22 to first of all reach the temperature for fusion of the solder at the ends of the connecting pieces 14 and then the fusion or softening of the adhesive so that the component 12a is forcefully ejected.

The invention is not limited to the embodiment of the device which has just been described and it is intended by the appended claims to include all technically equivalent means which come within the full scope and true spirit of the invention.

I claim:

1. A device for dismantling an electronic modular component having a plurality of connecting pieces soldered on a substrate forming a printed circuit, the said modular component being itself attached by its base on to the said substrate by means of a thermofusible adhesive agent, comprising in combination:
   (a) a substrate support having means for adjustably positioning the substrate support to permit said component to be guided to a predetermined position;
   (b) a positioning support adjacent said substrate support and at least one flexible member having a free end, said member being supported by said positioning support which includes means for bringing said free end of the flexible member in lateral contact with said component near its said base;
   (c) means for causing said flexible member to apply an adjustable resilient ejection force on said modular component when the latter is in said predetermined position
   (d) heating means for directing a hot gas toward said predetermined position to cause fusion of the solder and softening of the adhesive so that said adjustable force causes consequent ejection of said modular component in response to the applied thrust force.

2. A dismantling device according to claim 1, wherein the said heating means for directing a hot gas comprises a first gas source having a central opening for supplying hot gas at a first temperature and a second gas source having an annular opening surrounding the said central opening for supplying a hot gas at a second temperature which is lower than the said first temperature, said second gas source being directly connected to a source of hot gas and said first gas source including means for controlling the gas flow exiting the central opening.

3. A dismantling device according to claims 1 or 2, wherein said means for adjustably positioning said substrate support comprises a table movable along perpendicular axes.

4. A dismantling device according to claim 3, wherein said flexible member comprises a flexible needle, said needle being mounted at one end of said positioning support which is arranged to position said needle in the neighborhood of said predetermined position.

5. A dismantling device according to claim 4, wherein said positioning support comprises a base, a needle carrier, and a guide, said guide being movable along said base along an axis of displacement directed towards the said predetermined position and said needle carrier being pivotally mounted on said guide about a horizontal axis perpendicular to the axis of displacement.

6. A dismantling device according to claim 5, further including means for longitudinal positioning said needle carrier and means on said carrier for permitting adjustment of the useful length of said needle projecting from said needle carrier.

7. A dismantling device according to claim 5, wherein said needle is slightly inclined to the horizontal when it is in the resilient thrust position, laterally of said component.

8. A dismantling device according to claim 5, further comprises a thermal screen, and means for positioning said screen around said component to protect neighboring circuit elements on said substrate.

9. A device according to claim 8, wherein said thermal screen has the general shape of a frame which widens out in the direction of the said heating means.

10. A device for dismantling an electronic modular component having a plurality of conductors soldered on a substrate to form a printed circuit, said modular component being itself attached by its base on to said substrate by means of a thermofusable adhesive it comprising in combination:
   (a) a first positionable substrate support, means for adjustably positioning said support to permit said component to be located at a predetermined position;
   (b) a second fixed support adjacent said first support and supporting a positionable flexible member having a free end, said member adapted to be positioned on said fixed support to bring said free end of the flexible member in lateral contact with the component near its base, (c) means for causing said flexible member to apply an adjustable resilient ejection force to said modular component when said component is in the said predetermined position; and (d) heating means for directing a hot gas over said component to fuse the solder connection and soften the adhesive thereby separating the modular component from the substrate.

11. A dismantling device according to claim 10, said means for directing a hot gas comprising a fist gas flow tube having a central opening connected to a source of hot gas at a first temperature, a second coaxial gas flow tube having an annular opening surrounding said central opening and connected to a source of hot gas at a second temperature which is lower than the said first temperature.

12. A device as set forth in claim 11, wherein said first gas flow tube includes means for controlling the gas flow therethrough.

13. A dismantling device according to claim 11 wherein said means for positioning said substrate support comprises a table, first and second guides disposed along mutually perpendicular axes and means for supporting said table in one of said guides, said one of said guides being supported in the other of said guides such that said table may be positioned along said axes to said predetermined position.

14. A dismantling device according to claim 11, wherein said means for applying the resilient ejection force comprises a flexible needle, said needle being mounted at one end of a positionable needle carrier mounted on said fixed support.

15. A dismantling device according to claim 14, wherein said positionable needle carrier includes a fixed base and a stand, said stand being movable in a guide on said base whose axis of displacement is directed towards said predetermined position, and said needle carrier being pivotally mounted on said stand about a horizontal axis perpendicular to the axis of displacement.

16. A dismantling device according to claim 15, wherein said needle carrier includes a mechanism for positioning said needle along the axis of the carrier and permitting adjustment of the useful length of the said needle to allow it to project from said needle carrier a selected distance.

17. A dismantling device according to claims 15 or 16, wherein said needle is inclined to the horizontal in the force applying position.

18. A dismantling device according to claim 11 further including a thermal screen, and means for positioning said screen around the said component to protect the neighboring circuit elements on the said substrate.

19. A device according to claim 18, wherein said thermal screen includes an opening in one wall thereof to permit insertion therethrough of the flexible member.

20. A device for dismantling an electronic modular component having a plurality of connecting pieces soldered on a substrate forming a printed circuit, the said modular component being itself attached by its base on to the said substrate by means of a thermofusible adhesive agent, comprising in combination:

(a) a substrate support having means for adjustably positioning the substrate support to permit said component to be guided to a predetermined position;

(b) a positioning support, a flexible needle member mounted at one end of said positioning support for applying an adjustable resilient thrust to said modular component when the latter is in said predetermined position; means for positioning said support in the neighborhood of said predetermined position, and (c) means for directing a hot gas toward said predetermined position to cause fusion of the solder and softening of the adhesive and consequent ejection of said modular component in response to the applied thrust, said means for directing a hot gas comprising a first gas source having a central opening for supplying hot gas at a first temperature and a second gas source having an annular opening surrounding the said central opening for supplying a hot gas at a second temperature which is lower than the said first temperature, said second gas source being directly connected to a source of hot gas and said first gas source including means for controlling the gas flow exiting the central opening.

21. A dismantling device according to claim 20 wherein said positioning support comprises a base, a needle carrier, and a guide, said guide being movable along said base along an axis of displacement directed towards the said predetermined position and said needle carrier being pivotally mounted on said guide about a horizontal axis perpendicular to the axis of displacement.

22. A dismantling device according to claim 21 further including means for longitudinal positioning said needle carrier and means on said carrier for permitting adjustment of the useful length of said needle projecting from said needle carrier.

23. A dismantling device according to claim 21 wherein said needle is slightly inclined to the horizontal when it is in the resilient thrust position, laterally of said component.

24. A dismantling device according to claim 21 further comprising a thermal screen, and means for positioning said screen around said component to protect neighboring circuit elements on said substrate.

25. A device according to claim 24 wherein said thermal screen has the general shape of a frame which widens out in the direction of the said heating means.

26. A device for dismantling an electronic modular component having a plurality of conductors soldered on a substrate to form a printed circuit, said modular component being itself attached by its base on to said substrate by means of a thermofusible adhesive it comprising in combination:

(a) a positionable substrate support, means for adjustably positioning said support to permit said component to be located at a predetermined position; said means for adjustable positioning said substrate support comprises a table, first and second guide disposed along mutually perpendicular axes and means for supporting said table in one of said guides, said one of said guides being supported in the other of said guides such that said table may be positioned along said axes to said predetermined position, (b) flexible needle means for applying an adjustable resilient force to said modular component when said component is in the said predetermined position; said needle being mounted at one end of a positionable needle carrier;

(c) means for directing a hot gas over said component to fuse the solder connection and soften the adhesive thereby separating the modular component from the substrate, said means for directing a hot gas comprising a first gas flow tube having a central opening connected to a source of hot gas at a first temperature, a second coaxial gas flow tube having an annular opening surrounding said central opening and connected to a source of hot gas at a second temperature which is lower than the said first temperature, said first gas flow tube includes means for controlling the gas flow therethrough.

27. A dismantling device according to claim 26, wherein said positionable needle carrier includes a fixed base and a stand, said stand being movable in a guide on said base whose axis of displacement is directed towards said predetermined position, and said needle carrier being pivotally mounted on said stand about a horizontal axis perpendicular to the axis of displacement.

28. A dismantling device according to claim 27, wherein said needle carrier includes a mechanism for positioning said needle along the axis of the carrier and permitting adjustment of the useful length of the said needle to allow it to project from said needle carrier a selected distance.

29. A dismantling device according to claim 27 wherein said needle is inclined to the horizontal in the force applying position.

30. A dismantling device according to claim 26 further including a thermal screen, and means for positioning said screen around the said component to protect the neighboring circuit elements on the said substrate.

31. A device for dismantling an electronic modular component having a plurality of connecting pieces soldered on a substrate forming a printed circuit, said modular component being itself attached by its base on to said substrate by means of a thermofusible adhesive agent, comprising in combination:
 (a) a substrate support having means for adjustably positioning the substrate support to permit said component to be guided to a predetermined position;
 (b) a flexible member positioning support adjacent said substrate support, at least one flexible member supported by said positioning support and having a free end, means on said positioning support for bringing said free end of the flexible member in lateral contact with said component near its said base;
 (c) means for applying an adjustable ejection force on said flexible member;
 (d) and heating means for causing fusion of the solder and softening of the adhesive, so that said adjustable force causes said modular component to be ejected.

32. A dismantling device according to claim 31 wherein the said flexible member is a needle.

33. A dismantling device according to claim 31 wherein said heating means include means for directing a hot gas onto said component.

* * * * *